US006535030B1

(12) United States Patent
Nix

(10) Patent No.: US 6,535,030 B1
(45) Date of Patent: Mar. 18, 2003

(54) DIFFERENTIAL COMPARATOR WITH OFFSET CORRECTION

(75) Inventor: Michael A. Nix, Buda, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/884,725

(22) Filed: Jun. 19, 2001

(51) Int. Cl.[7] ............................................. H03K 5/22
(52) U.S. Cl. ........................ 327/65; 327/562; 330/253
(58) Field of Search .............................. 327/63, 65–67, 327/77, 89, 560–563; 330/253, 255, 258, 311

(56) References Cited

U.S. PATENT DOCUMENTS

| | | | |
|---|---|---|---|
| 3,851,270 A | * | 11/1974 | Vosteen ....................... 330/253 |
| 4,665,326 A | | 5/1987 | Domogalla |
| 5,610,557 A | * | 3/1997 | Jett, Jr. ........................ 330/255 |
| 6,252,435 B1 | * | 6/2001 | Wu et al. ....................... 327/65 |
| 6,359,511 B1 | * | 3/2002 | Phanse et al. ............... 330/254 |

* cited by examiner

Primary Examiner—Toan Tran
(74) Attorney, Agent, or Firm—Russell D. Slifer; H. C. Chan

(57) ABSTRACT

A differential comparator having offset correction and common mode control providing stable op amp output that changes only due to the original inputs coming into the comparator. The difference comparator has increased common-mode difference tolerance, and large op-amp offset tolerance, as well as fast decision time.

3 Claims, 6 Drawing Sheets

DIFFERENTIAL COMPARATOR WITH OFFSET CORRECTION

FIELD OF THE INVENTION

The present invention relates generally to differential comparators, and more specifically to offset correction within differential comparators.

BACKGROUND OF THE INVENTION

A difference comparator is a circuit that accepts inputs and determines a difference between them. Typical difference comparators take two inputs and return a signal indicating which of the signals is higher. Many circuits use difference comparators, such as an analog to digital converter (ADC). As integrated circuit designs continue to decrease in size, and power requirements continue to be lowered, characteristics that were not once very important in circuit design have come to the forefront. For example, given the close placement of components on typical integrated circuit chips, parasitic charges and the like have become important factors that must be dealt with in the design of circuits.

Further, difference comparators are increasingly called on to make discrimination of differences in ever faster and faster times. For example, in communications circuits, strict tolerances on difference comparators have rendered some previous designs unsuitable for use, since they cannot accurately provide a quick enough difference comparison, or cannot work within the tolerances required by modern circuitry.

In communications networks such as 1000BaseT communications chips, for example, a difference comparator must at least be able to presently provide a decision time of less than about 3 nanoseconds, and must be able to accommodate 50 millivolts (mV) of difference between a reference common mode and a signal common mode to be applicable to the present type of application.

FIG. 1 shows a difference comparator comprising two input sources hooked to two current sources. The current for each source splits based on the voltages on the input gates. If $V_{in}$ and $V_{ref}$ have the same common mode voltage, the current in the top diode devices is the same as a differential voltage. If, however, the common modes of the signals are not the same, non-linearities in the devices hurt performance. Any significant amount of signal swing reduces performance greatly.

FIG. 2 shows a difference comparator with input signals split so that positive signals are presented to a first differential pair, and negative signals are presented to another differential pair. The currents are subtracted from a constant current source on the right side, which helps to eliminate the swing problem of the device of FIG. 1, but which requires very sensitive matching of devices between the top and the bottom. In fact, it is not currently possible to easily match devices sufficiently closely to allow for reasonable operation of the device of FIG. 2. Temperature and process variations affect this circuit too much for it to be reliable. A skew in the P vs N parameters for the two differential pairs causes a mismatch in the output currents resulting in no rejection of the common mode difference Therefore, what is needed is a difference comparator capable of good common mode rejection, which corrects offset, and which operates at high speed.

SUMMARY OF THE INVENTION

In one embodiment, a differential comparator comprises an input stage, and an operational amplifier comprising a differential current mirror circuit to provide differential output currents. The output currents are established in response to input signals, a common mode signal, and offset signals.

In another embodiment, an analog to digital converter (ADC) comprises a difference comparator and a latch connected to an output of the difference comparator. The difference comparator comprises a capacitively coupled input stage, and an operational amplifier comprising a differential current mirror circuit to provide differential output currents. The output currents are established in response to input signals, a common mode signal, and offset signals.

An operational amplifier, in another embodiment, comprises a main current control branch comprising a first differential pair of transistors. Each of the pair of first differential transistors are coupled in series with a diode connected transistor. The gates of the first differential pair are connectable to receive input voltages. An output branch comprises a pair of current mirror transistors each gate connected to a gate of one of the diode-connected transistors. A gain branch comprises a second differential pair of transistors. Each of the pair of second differential transistors are connected to a drain of one of the current mirror transistors and gate connected to one of the input voltages. A zeroing branch comprises a tail current transistor having its drain coupled to ground, and a third differential pair of transistors each connected between a gate of one of the diode connected transistors and the tail current transistor. Each transistor of the third differential pair has a gate connected to a common mode reference voltage. A fourth differential pair of transistors are each connected between a drain of one of the current mirror transistors and gate connected to one of a positive and a negative offset input.

Other embodiments are described and claimed.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
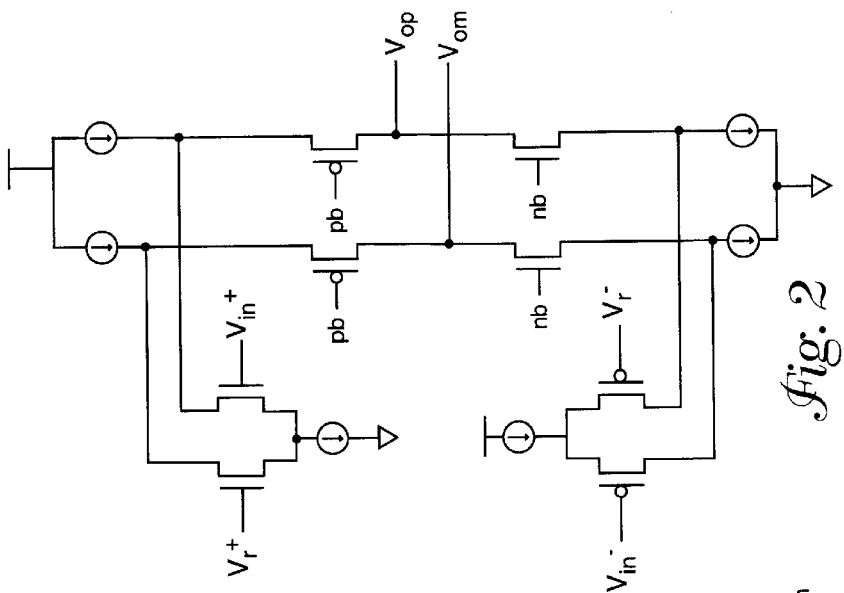
FIGS. 1 and 2 are circuit diagrams of prior art difference comparators.
Figure 2:
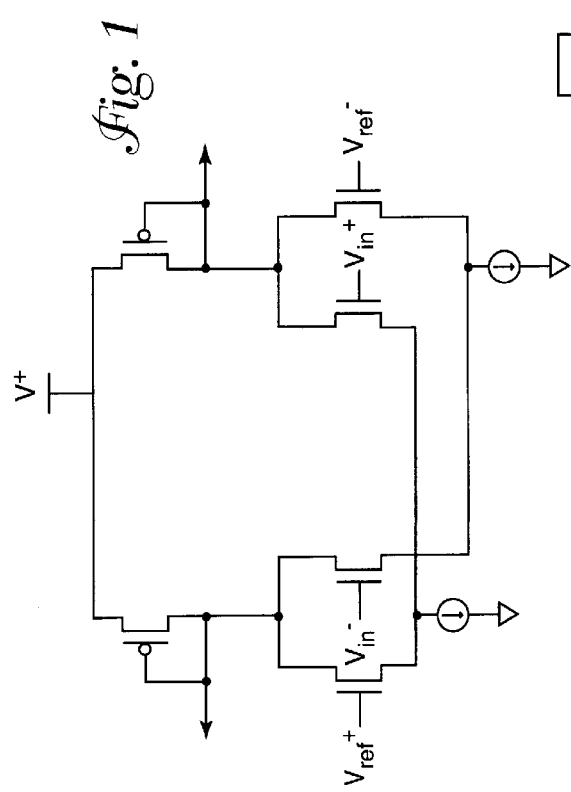
Figure 3:
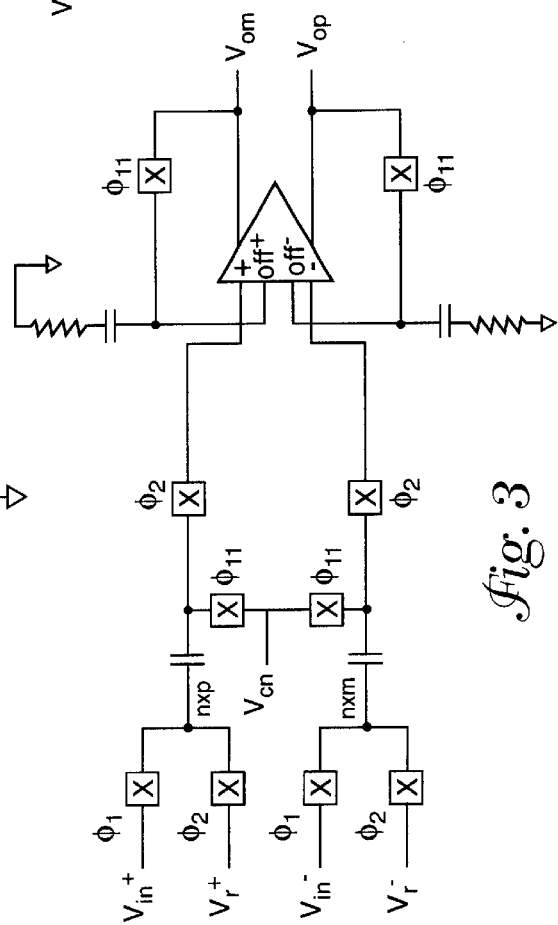
FIG. 3 is a schematic diagram of a comparator having offset correction.

FIG. 3 shows a difference comparator, which applies two sets of voltages to capacitors, saves the voltages, and applies them to an op amp. This gives the opportunity to cancel offsets by saving offsets on one phase and canceling them on the next. This device is effective at rejecting a common mode difference between the input signal and a reference signal, but does poor job of sampling the signals when they are not close to the common mode voltage, because charge injection from the switches on to the nxp and nxm nodes is different when $V_{in+}$ and $V_{in-}$ are far apart. The errors on the charge on the two capacitors can be very large compared to a least significant bit of an analog to digital converter in which the circuit is used.

Figure 4:
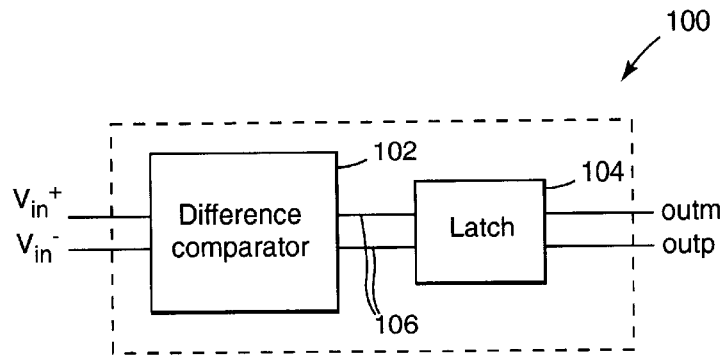
FIG. 4 is a block diagram of an analog to digital converter according to one embodiment of the present invention.

FIG. 4 is a block diagram of an embodiment of an analog to digital converter (ADC) 100. ADC 100 comprises in this embodiment a difference comparator 102 and a latch 104. The difference comparator 102 accepts a pair of input voltages and generates two output signals 106. The difference comparator 102 is operatively connected to latch 104 so that latch 104 receives signals 106 from difference comparator 102. The difference comparator 102 has in one embodiment offset correction and common mode control.

Figure 5:
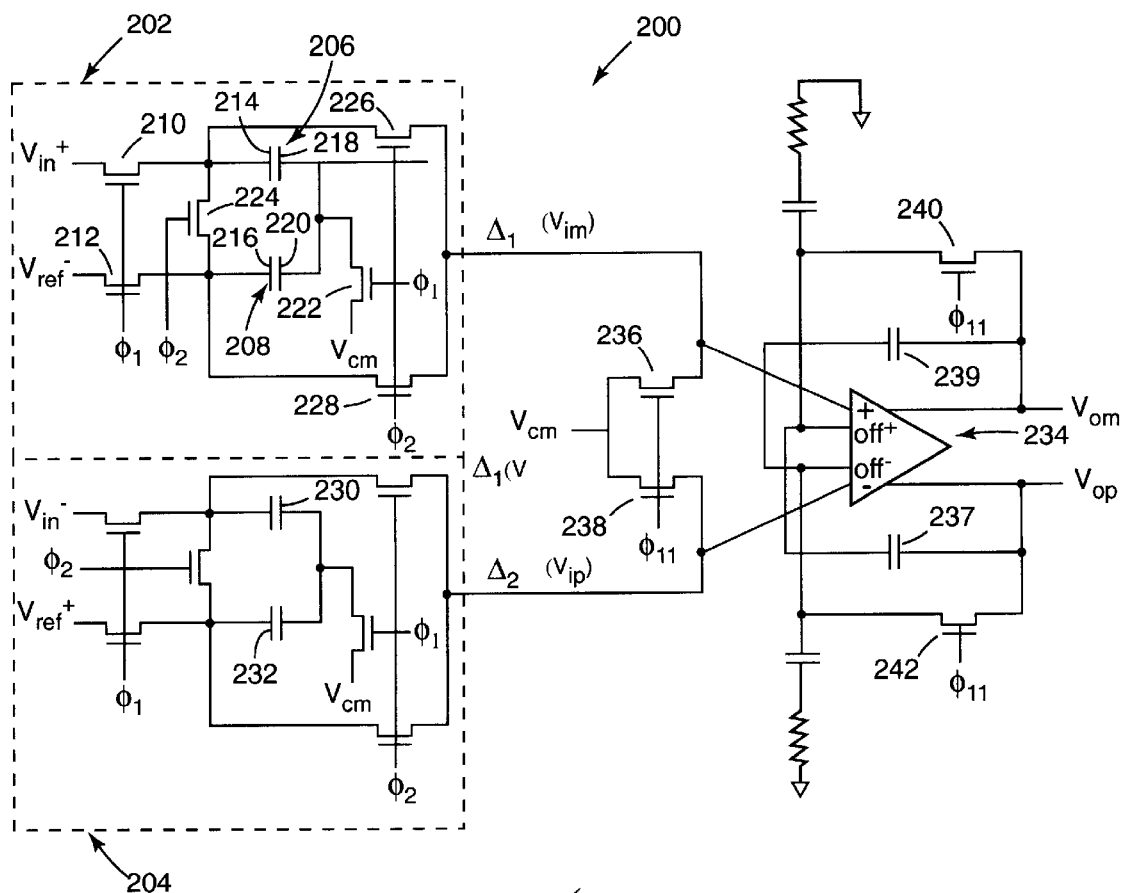
FIG. 5 is a circuit diagram of another embodiment of the present invention.

FIG. 5 is a schematic diagram of a difference comparator 200, such as difference comparator 102, according to one embodiment of the invention. Difference comparator 200 comprises in this embodiment first and second input branches 202 and 204. Each branch 202 and 204 is connectable to a reference signal $V_{ref}$ and an input signal $V_{in}$. In one embodiment, the input signals comprise differential input voltages $V_{in+}$ and $V_{in-}$, approximately centered about a common mode voltage level, and reference voltages $V_{ref+}$ and $V_{ref-}$ also approximately centered about the common mode voltage. Branch 202 in this embodiment determines the voltage difference between $V_{in+}$ and $V_{ref-}$ and branch 204 determines the voltage difference between $V_{ref+}$ and $V_{in-}$. Each branch operates in similar fashion, as described below.

The input voltages to branch 202 in one embodiment are $V_{in+}$ and $V_{ref-}$. To determine the difference between these two voltages, the following is undertaken. During a first, or sampling, phase, φ1, two capacitors 206 and 208 are charged. The capacitors 206 and 208 are connected, respectively, to $V_{in+}$ and $V_{ref-}$, through transistor switches 210 and 212. During phase φ1, the signal to the gate of the transistors 210 and 212 is high, passing the input and reference voltages to the plates 214 and 216 of the capacitors 206 and 208. During phase φ1, the other plates 218 and 220 of the capacitors 206 and 208 are shorted together to the common mode voltage through transistor 222. During phase φ1, transistors 224, 226, and 228 are connected to a low signal at their gates, and are off. During a second phase φ2, the signals at the gates of transistors 210, 212, and 222 go low, turning those transistors off. The signals at the gates of transistors 224, 226, and 228 go high, turning those transistors on. At that time, the plates 218 and 220 are left floating, and plates 214 and 216 are shorted together by transistor 224. The charges on the capacitors 206 and 208 are therefore shared, creating a difference $\Delta 1 = V_{in+} - V_{ref-} = V_{im}$.

Branch 204 is laid out substantially identically to branch 202, with the exception of the input voltages presented to the capacitors 230 and 232, which are in this embodiment $V_{in-}$ and $V_{ref+}$, respectively. The output generated by branch 204 is a difference $\Delta 2 = V_{ref+} - V_{in-} = V_{ip}$.

Once the input signals are processed by the input branches, signals $V_{im}$ and $V_{ip}$ are presented to operational amplifier 234 to be amplified and offset corrected. Op amp 234 has as signal inputs the outputs Δ1 and Δ2 of branches 202 and 204, and feedback signals coupled to offset inputs of the op amp 234. During most of the sampling phase φ1, the signal inputs of the op amp 234 are coupled to a common mode reference voltage through transistors 236 and 238. The feedback inputs of the op amp 234 are connected to the outputs $V_{op}$ and $V_{om}$ of the op amp 234 through transistors 240 and 242 respectively. Transistors 236 and 238 are gate connected to a phase φ11 signal. Transistors 240 and 242 are also gate connected to the phase φ11 signal. Phase φ11 is controlled to provide a zeroing operation on the operational amplifier. In this embodiment, the zeroing operation ends and phase φ11 goes low slightly before φ1 goes low. This is done at the end of the sampling phase where the switches (236, 238, 240, and 242) around the op amp 234 are turned off to save the offset values.

The offset operation is provided to balance the op amp. That is, using a common input, such as $V_{cm}$, the output signals should be equal. If the op amp is not balanced, however, the difference between $V_{op}$ and $V_{om}$ is stored on offset capacitors 237 and 239. The offset input voltages therefore balance the op amp prior to amplifying input signals, as explained in more detail below.

Figure 6:
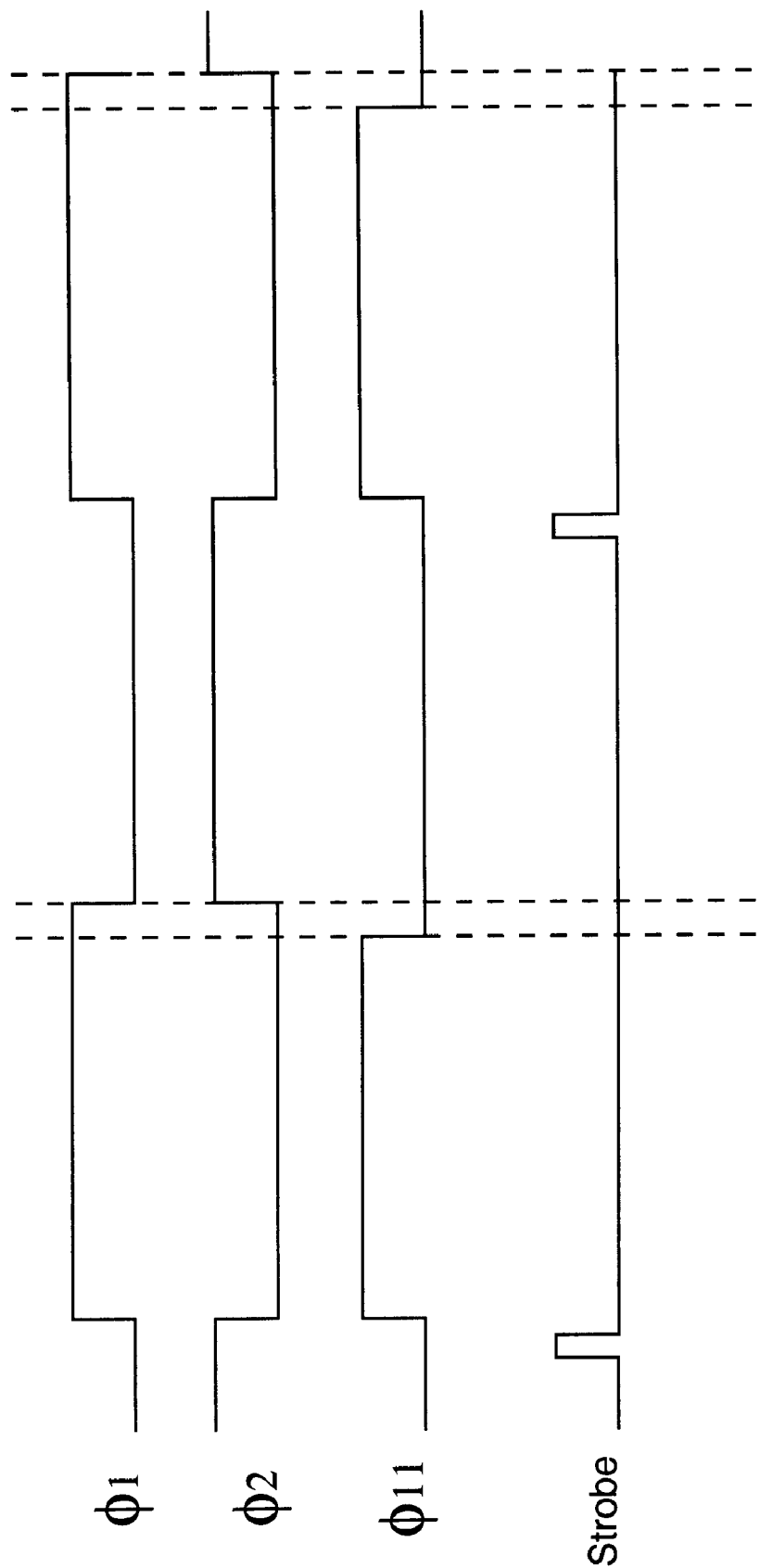
FIG. 6 is a timing diagram for an embodiment of the present invention.

A timing diagram for the operation of phases φ1 and φ2 is shown in greater detail in FIG. 6. In the zeroing phase φ11, the op amp 234 is zeroed by the input of the reference common mode voltage to the inputs. The outputs from the op amp based on the $V_{cm}$ inputs are fed back to the offset inputs of the op amp to zero the op amp. As stated above, the offsets are stored on storage capacitors. Input signals $V_{ip}$ and $V_{im}$ are applied to the op amp inputs during the evaluation phase after the end of phase φ1 when the φ11 signal is low. This isolates the feedback signals from the offset inputs, and applies the $V_{ip}$ and $V_{im}$ signals instead of $V_{cm}$ signals to the op amp signal inputs. During phase φ2, the difference between input signals $V_{ip}$ and $V_{im}$ to the op amp is amplified and presented to latch 104. The DC offset of the inputs, stored in storage capacitors, is allowed to settle along with the outputs $V_{op}$ and $V_{om}$. Near the end of the evaluation phase, the strobe signal momentarily goes high, coupling the op amp outputs to the latch, allowing the latch to separate quickly as described in further detail below.

Figure 7:
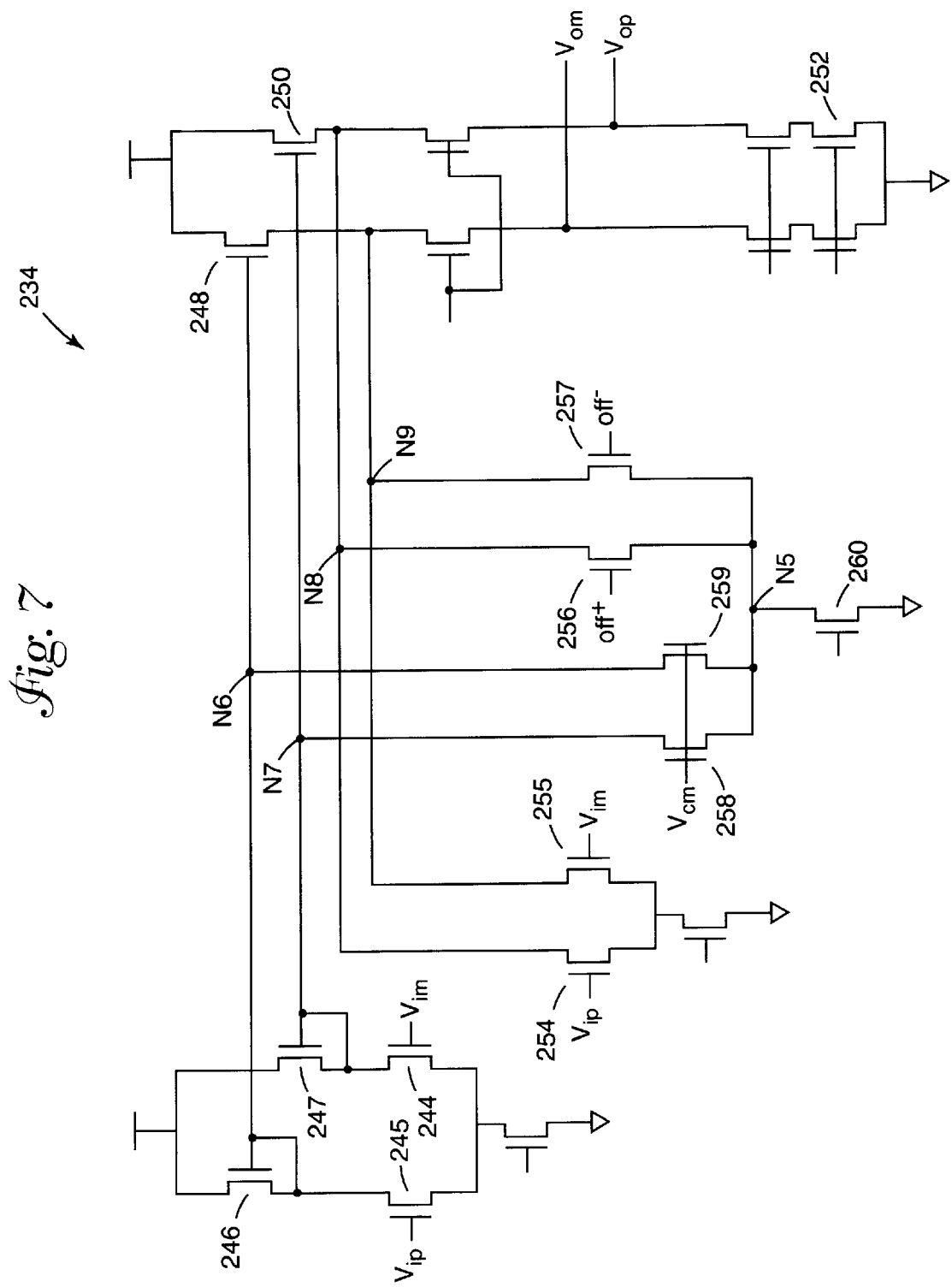
FIG. 7 is a circuit diagram of an op amp according to one embodiment of the present invention.

In one embodiment of the op amp 234, as is shown in greater detail in FIG. 7, the inputs $V_{ip}$ and $V_{im}$ are coupled to a differential pair of transistors 244 and 245. Diode connected transistors 246 and 247 are coupled to the differential pair 244 and 245 and generate voltages at nodes N6 and N7. A current conducted through transistor 246 is mirrored to transistor 248. Likewise, a current conducted through transistor 247 is mirrored to transistor 250. The currents provided through transistors 248 and 250 generate output voltages $V_{om}$ and $V_{op}$. These output voltages are adjusted by the remaining circuitry.

The inputs $V_{op}$ and $V_{im}$ are also connected to another differential pair of transistors 254 and 255. The second differential pair 254 and 255 provide discharge paths for transistors 248 and 250 that complement differential transistors 244 and 245. That is, if $V_{ip}$ is greater than $V_{im}$, transistors 246 and 248 conduct more current than transistors 247 and 250. As such, $V_{om}$ is increased and $V_{op}$ is decreased. Transistors 254 and 255 complement this difference. For example, transistor 254 conducts more current than transistor 255 when $V_{ip}$ is greater than $V_{im}$. Thus, more current from transistor 250 is sunk through transistor 254 than current sunk from transistor 248 through transistor 255. The difference in $V_{om}$ and $V_{op}$, therefore, is further amplified.

A third differential pair of transistors 256 and 257 is connected to the offset signal inputs. A fourth differential pair of transistors 258 and 259 is connected to the common mode voltage $V_{cm}$. Together, these differential pairs control the common mode voltage. Transistor 260 establishes a tail current that is shared by transistors 256, 257, 258, and 259.

During the zeroing phase (φ11), transistors 256 and 257 are adjusted by the voltages on the offsets off+ and off− to provide a zero offset between $V_{op}$ and $V_{om}$. The combination of transistors 256, 257, 258, and 259 centers $V_{op}$ and $V_{om}$ about reference common mode $V_{cm}$. That is, if the common mode of $V_{op}$ and $V_{om}$ is less than $V_{cm}$, transistors 258 and 259 conduct more current and reduce source currents through transistors 248 and 250. This reduces drain currents through transistors 256 and 257. Likewise, if the output common mode of $V_{op}$ and $V_{om}$ is greater than $V_{cm}$, transistors 256 and 257 sink more current. The output has a zero input offset centered on $V_{cm}$ after the zeroing phase φ11.

Figure 8:
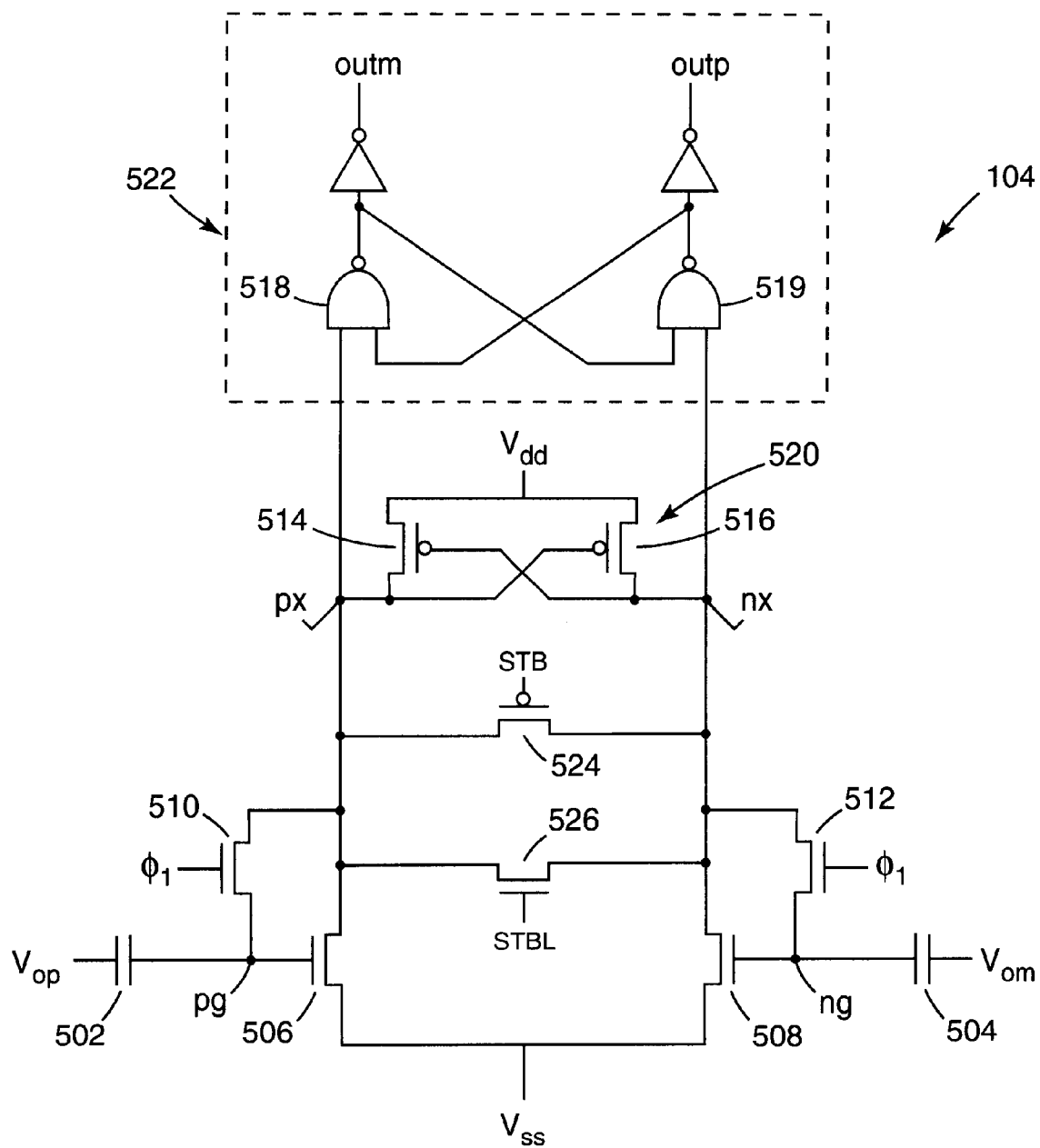
FIG. 8 is a circuit diagram of a latch according to another embodiment of the present invention.

The signals $V_{om}$ and $V_{op}$, which are output by op amp 234, are presented to latch 104. Latch 104 is shown in greater detail in FIG. 8. Input signals Vop and Vom to the latch are, during phase φ1, isolated from the main portion of the latch by coupling capacitors 502 and 504, and diode connected transistors 506 and 508. Nodes nx and px provide voltages to the gates of transistors 514 and 516, respectively, of sense amp 520, and to one of the inputs of cross-coupled NAND gates 518 and 519 of NAND latch 522. Transistors 524 and 526 are connected between nodes px and nx, and have their gates connected to a strobe (STB) and a strobe low (STBL) signal, respectively. When the STB signal is low, its complement STBL is high, and nodes nx and px are equilibrated.

During φ1, the transistors 506 and 508 are diode coupled by the "on" status of transistors 510 and 512. Therefore, any voltages present at the inputs $V_{op}$ and $V_{om}$ to capacitors 502 and 504 do not change the state of the NAND latch 522. Nodes nx and px are held at a voltage that keeps the inputs to the NAND gates of NAND latch 522 high.

At the end of the sampling phase, φ1 goes inactive and φ2 goes active. The STB and STBL signals remain high and low respectively. At this point, the outputs $V_{om}$ and $V_{op}$ from the op amp 234 are separating at some nominal rate based on the gain of the amplifier. Transistors 506 and 508 are no longer diode coupled because transistors 510 and 512 turn off. During phase φ2, the capacitors 502 and 504 couple the inputs $V_{op}$ and $V_{om}$ to transistors 506 and 508, respectively. At the end of phase φ2, before φ2 goes low and φ1 goes active again, the strobe (STB) momentarily goes high. This turns off the equilibration between nodes px and nx to create a difference in current through transistors 506 and 508. If node px is lower than node nx, then node nx is pulled high via transistor 516 of the cross-coupled transistors 514 and 516. Similarly, if node px is higher than node nx, node px is pulled high via transistor 514 of the cross-coupled transistors 514 and 516. The NAND latch 522 quickly splits one way or the other depending upon the values at the nodes px and nx. When the strobe goes low again, the result is stored in the cross-coupled NAND gates 518 and 519, and another zeroing and sampling phase can begin with φ2 going inactive and φ1 going active.

Figure 9:
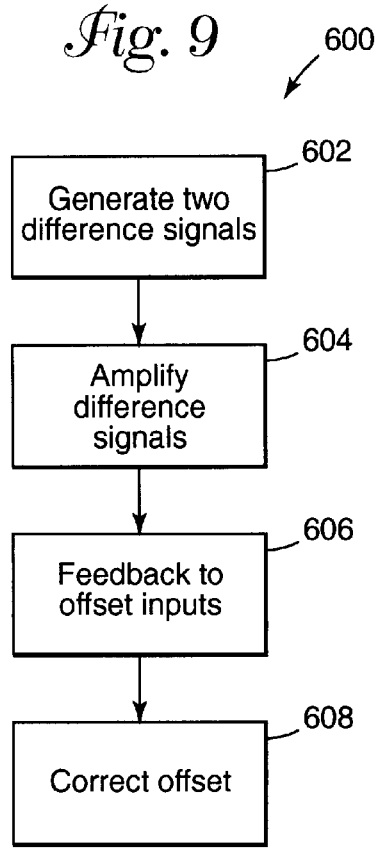
FIG. 9 is a flow chart diagram of a method according to another embodiment of the present invention.
Figure 9A:
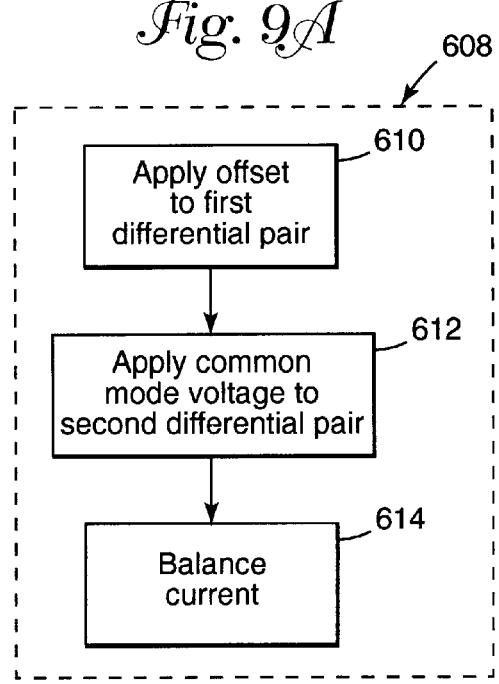
FIG. 9A is a flow chart diagram of an offset correction method of the present invention.

A method 600 for correcting offset in a difference comparator comprises in one embodiment generating two difference signals from a pair of inputs in block 602, and applying the difference signals to an amplifier in block 604. The amplifier output signals are fed back to offset correction inputs of the amplifier in block 606, and the offset is corrected in block 608. Offset correction 608 is shown in more detail in FIG. 9A. In one embodiment, offset correction 608 comprises applying the offsets to a first differential pair connected between a main current control voltage and a fixed current transistor in block 610, applying a common mode voltage to a second differential pair connected between a main current control adjustment voltage and the fixed transistor in block 612, and balancing the current between the first and the second differential pairs in block 614.

Figure 10:
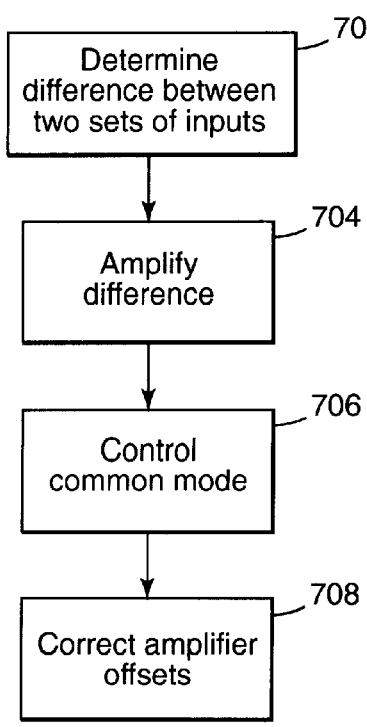
FIG. 10 is a flow chart diagram of a method according to another embodiment of the present invention.

Another method embodiment 700 of the present invention is shown in FIG. 10. Method 700 of correcting offset in a difference comparator, comprises determining a difference between two sets of inputs in block 702, and amplifying the difference with an amplifier in block 704. The common mode of the comparator is controlled in block 706, and the offsets of the amplifier are corrected in block 708. In one embodiment, controlling the common mode and correcting the offsets comprises averaging feedback signals from the amplifier, and balancing a current between a first differential pair connected to the feedback signals and a second differential pair connected to a system common mode voltage.

The embodiments of the present invention are amenable to use in any number of circuits. For example, any type of difference comparator for use in such products as analog to digital converters and the like is amenable to practicing the embodiment of the present invention.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An operational amplifier, comprising:
    a main current control branch comprising a first differential pair of transistors, each of the pair of first differential transistors are coupled in series with a diode connected transistor, the gates of the first differential pair are connectable to receive input voltages;
    an output branch comprising a pair of current mirror transistors each gate connected to a gate of one of the diode-connected transistors;
    a gain branch comprising a second differential pair of transistors, each of the pair of second differential transistors are connected to a drain of one of the current mirror transistors and gate connected to one of the input voltages; and
    a zeroing branch comprising,
        a tail current transistor having its drain coupled to ground,
        a third differential pair of transistors each connected between a gate of one of the diode connected transistors and the tail current transistor, each transistor of the third differential pair have a gate connected to a common mode reference voltage, and
        a fourth differential pair of transistors each connected between a drain of one of the current mirror transistors and the tail current transistor, and gate connected to one of a positive and a negative offset input.

2. An operational amplifier, comprising:
a first differential pair of transistors, each of the pair of first differential transistors are coupled in series with a diode-connected transistor, the gates of the first differential pair are connectable to input voltages;
a pair of current mirror transistors each having a gate connected to a gate of one of the diode connected transistors;
a second differential pair of transistors, each of the pair of second differential transistors are connected to a drain of one of the current mirror transistors and gate connected to one of the input voltages;
a tail current transistor having its drain coupled to ground;
a third differential pair of transistors each connected between a gate of one of the diode-connected transistors and the tail current transistor, each of the third differential pair of transistors have a gate connected to a common mode reference voltage; and
a fourth differential pair of transistors each connected between a drain of one of the current mirror transistors and the tail current transistor, and gate connected to one of a positive and a negative offset input.

3. A method of controlling a differential amplifier, comprising:
generating amplified first and second output currents in response to first and second input signals using a differential current mirror circuit, wherein the differential current mirror circuit comprises a first pair of input transistors coupled to a tail current transistor, and a first and second mirror transistors coupled to output nodes;
adjusting the first and second output current using a second pair of input transistors coupled to the output nodes to further amplify the output currents;
adjusting output voltages at the output nodes to have substantially zero offset; and
centering the output voltages to a common mode signal.

* * * * *